(12) United States Patent
Hoshi et al.

(10) Patent No.: US 6,565,822 B1
(45) Date of Patent: May 20, 2003

(54) EPITAXIAL SILICON WAFER, METHOD FOR PRODUCING THE SAME AND SUBTRATE FOR EPITAXIAL SILICON WAFER

(75) Inventors: Ryoji Hoshi, Nishishirakawa-gun (JP); Susumu Sonokawa, Nishishirakawa-gun (JP); Masahiro Sakurada, Nishishirakawa-gun (JP); Tomohiko Ohta, Nishishirakawa-gun (JP); Izumi Fusegawa, Nishishirakawa-gun (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 0 days.

(21) Appl. No.: 09/646,713
(22) PCT Filed: Jan. 26, 2000
(86) PCT No.: PCT/JP00/00379
§ 371 (c)(1), (2), (4) Date: Sep. 21, 2000
(87) PCT Pub. No.: WO00/46433
PCT Pub. Date: Aug. 10, 2000

(30) Foreign Application Priority Data

Feb. 1, 1999 (JP) ............................................. 11-023765

(51) Int. Cl.[7] ............................................. C09B 33/26
(52) U.S. Cl. ..................... 423/328.2; 117/19; 117/20; 117/30; 117/32
(58) Field of Search ..................... 117/13, 19, 20, 117/30, 32; 423/328.2

(56) References Cited

U.S. PATENT DOCUMENTS 6,008,128 A * 12/1999 Habuka et al. ............... 438/695
6,113,687 A * 9/2000 Horai et al. .................. 117/20
6,261,361 B1 * 7/2001 Iida et al. ..................... 117/19
6,334,896 B1 * 1/2002 Iida et al. ..................... 117/20

FOREIGN PATENT DOCUMENTS

JP 8-330316 12/1996
JP 11-130592 5/1999

OTHER PUBLICATIONS

Shimura, *Semiconductor Silicon Crystal Technology*, pp. 170–182 (1988).
*Nikkei MicroDevices*, pp. 87–109 (1986).
Freyhardt et al., *Silicon Chemical Etching*, Crystals, pp. 3–57 (1982).
Dupret et al., *Global Modelling of Heat Transfer in Crystal Growth Furnaces*, Int. J. Heat Mass Transfer, vol. 33, No. 9, pp. 1849–1871 (1990).

* cited by examiner

*Primary Examiner*—Felisa Hiteshew
(74) *Attorney, Agent, or Firm*—Oliff & Berridge, PLC

(57) ABSTRACT

An epitaxial silicon wafer, which has no projections having a size of 100 nm or more and a height of 5 nm or more on an epitaxial layer, and a method for producing an epitaxial silicon wafer, wherein a single crystal ingot containing no I-region is grown when a silicon single crystal is grown by the CZ method, and an epitaxial layer is deposited on a silicon wafer sliced from the single crystal ingot and containing no I-region for the entire surface. An epitaxial wafer of high quality with no projection-like surface distortion observed as particles on an epi-layer surface is provided by forming a wafer having no I-region for the entire surface from a single crystal and depositing an epitaxial layer thereon, and a single crystal having no I-region for entire plane is produced with good yield and high productivity, thereby improving productivity of epi-wafers and realizing cost reduction.

19 Claims, 5 Drawing Sheets

(a)  (b)

(a)

(b)

EPITAXIAL SILICON WAFER, METHOD FOR PRODUCING THE SAME AND SUBTRATE FOR EPITAXIAL SILICON WAFER

TECHNICAL FIELD

The present invention relates to a large diameter epitaxial silicon wafer, a method for producing the same, and a substrate for an epitaxial silicon wafer.

BACKGROUND ART

Most of currently manufactured devices such as operational elements and memories are fabricated on a surface of a wafer, which is manufactured from a silicon single crystal that has been pulled by the Czochralski method (CZ method). In these devices, electric circuits are formed by utilizing an extremely thin surface layer of silicon wafer and operated. As means for improving quality of the surface layer and preventing latch-up, an epitaxial silicon wafer (hereafter also referred to as "epi-wafer") is often used.

The epi-wafer is produced by growing an epitaxial layer (hereafter also referred to as "epi-layer") on a wafer sliced from a silicon single crystal grown by the CZ method or the like. So far, as concerns epi-wafer, not so much attention has been paid for the quality of mirror surface silicon wafers used as substrates, since an epi-layer is deposited thereon.

In a crystal, there are generally two kinds of point defects formed during the crystal growth, i.e., one is vacancy and the other is self interstitial atom (interstitial-Si). A region where depressions, voids and so forth generated due to missing of silicon atoms are dominantly present among the above defects is called V-region. A region where dislocations generated due to presence of excessive silicon atoms and self interstitial atoms such as aggregations of excessive silicon atoms are dominant is called as I-region. In the V-region, there are grown-in defects considered to be originated from voids, i.e., aggregations of void-type point defects, such as FPD, LSTD and COP, at a high density. In the I-region, there are present L/D (abbreviation of interstitial dislocation loop: LSEPD, LFPD and so forth) defects, which are considered to be originated from dislocation loops, at a low density.

The boundary between the V-region and the I-region in the crystal is decided by the ratio of the crystal growth rate F [mm/min] and the temperature gradient G [° C./mm] along the crystal growth axis direction in the vicinity of the crystal growth interface, F/G (G is a value obtained by dividing the temperature difference of 12° C. between the melting point of silicon, 1412° C., and 1400° C. by a distance [mm] between the points of 1412° C. and 1400° C. along the axial direction). If this F/G exceeds a certain value, the crystal becomes the V-region, and if F/G is lower than the certain value, the crystal becomes the I-region.

Generally, the temperature gradient G along the crystal growth axis direction shows distribution along the radial direction in the crystal growth interface, and it becomes smaller at the center and becomes larger at the periphery of the crystal (see FIG. 1). Since the crystal growth rate in a growing crystal is constant along the radial direction, distribution of F/G along the radial direction should be a reciprocal of the distribution of G along the radial direction. If F/G exceeds a certain value for the entire crystal growth interface, there is obtained a crystal that provides a wafer with no I-region for the entire plane. However, this may not usually be considered for a portion within 20 mm of the outermost periphery, since point defects can out-diffuse to the crystal surface and can be eliminated in this portion. For example, in case of a crystal having a usual resistivity (that having a resistivity of 0.03 Ω·cm or more in the present invention), if F/G is 0.18 mm$^2$/° C.·min or more for the entire inner portion except for the peripheral portion within 20 mm, there can be obtained a crystal providing the V-region for the entire plane. Conversely, if F/G is 0.18 mm$^2$/° C.·min or less for the entire inner portion except for the peripheral portion within 20 mm, there can be obtained a crystal providing the I-region for the entire plane.

Under such a situation as described above, in the production of large diameter crystals having a diameter of 10 inches or more, which will be a main stream in future, the difference of G between the center and periphery of a crystal becomes large, and growth rate F is decreased due to increase in solidification latent heat. Therefore, it has become difficult to attain such an F/G that the V-region should be obtained for full radius of the crystal. For this reason, the I-region and the V-region tend to coexist in a wafer plane, and most of commercially available large diameter wafers contain the I-region.

By the way, P-type low resistivity wafers having a resistivity of 0.03 Ω·cm or less, which are currently often used as substrates for epi-wafers, contain boron with a small covalent radius at a high concentration. Therefore, self interstitial atoms are likely to exist therein, and the value of F/G deciding the boundary of the I-region and the V-region becomes larger in connection with decrease in resistivity. Thus, most of commercially available P-type low resistivity wafers contain the I-region.

Under the recent stream of using a larger diameter of crystals and a lower temperature for the growth of epi-layers, it has become more frequent to produce epi-wafers comprising a large diameter crystal having a diameter of 10 inches or more, on which an epi-layer is grown at a lower temperature. Under such a circumstance, it has become more frequent to find, on the epi-wafers, particles that have not been observed on conventional wafers. Study of these particles has revealed that they correspond to particles that are detected on mirror wafer surfaces used as substrates by the high sensitivity particle measurement method, and they constitute projection type surface distortion observed as projections or particles when observed by AFM (atomic force microscope) or the like (they are also referred to as "projection-like particles" hereinafter).

It has been also revealed that these projections become still larger when an epitaxial layer is deposited, and they may also be detected as usual particles or the like. It has been also found that many of these projections are present in the I-region, which has conventionally been considered to have fewer defects. These projections and projection-like particles may cause breaking of wiring and so forth when an integrated circuit is formed on the wafer surface in the device production process. Therefore, they greatly affect device characteristics and reliability of devices, and thus their presence cannot be accepted in view of required quality of epi-wafers.

DISCLOSURE OF THE INVENTION

The present invention was accomplished in view of the problems described above, and its major object is to provide an epitaxial wafer of high quality with no projection-like particles on its epi-layer surface by forming a wafer not having the I-region for the entire surface from a single crystal of a large diameter and depositing an epitaxial layer thereon, and to produce a single crystal of a large diameter having no I-region for entire plane with good yield and high productivity, thereby improving productivity of epi-wafers and realizing cost reduction.

The present invention was accomplished in order to achieve the aforementioned object. According to the first aspect of the present invention, there is provided an epitaxial silicon wafer, which has no projections having a size of 100 nm or more and a height of 5 nm or more on an epitaxial layer. Such an epitaxial silicon wafer substantially does not have, on its epi-layer, projections or projection-like particles of the size defined above, which are harmful to quality of the wafer. Therefore, it scarcely suffer from breaking of wiring during the device production process, and thus there can be provided an epitaxial wafer of high quality, which does not adversely affect the device characteristics and the reliability of devices.

According to the second aspect of the present invention, there is provided a method for producing an epitaxial silicon wafer, wherein a silicon wafer which has no projections having a size of 100 nm or more and a height of 5 nm or more is used as a silicon wafer for an epitaxial substrate.

If a silicon wafer which has no projections having a size of 100 nm or more and a height of 5 nm or more is used for an epitaxial substrate as described above, an epitaxial silicon wafer of high quality can be produced, which does not have, on its epi-layer after epitaxial growth, projections or projection-like particles having a size of 100 nm or more and a height of 5 nm or more, which degrade device characteristics.

Further, according to the third aspect of the present invention, there is provided a method for producing an epitaxial silicon wafer, wherein a single crystal containing no I-region is used as a silicon wafer for an epitaxial substrate.

If a wafer is sliced from a single crystal containing no I-region, which is a cause of generating many projections on the epitaxial layer, and the silicon wafer having no I-region in the entire surface is used for an epitaxial substrate as described above, an epitaxial silicon wafer of high quality can be produced, which does not have, on the epitaxial layer, projections having a size of 100 nm or more and a height of 5 nm or more.

Furthermore, according to the fourth aspect of the present invention, there is provided a method for producing an epitaxial silicon wafer, wherein a silicon single crystal ingot containing no I-region is grown when a silicon single crystal is grown by the Czochralski method, and an epitaxial layer is deposited on a silicon wafer sliced from the single crystal ingot and containing no I-region for the entire plane.

If a silicon single crystal containing no I-region is grown when a silicon single crystal is grown by the CZ method, and an epitaxial layer is deposited on a silicon wafer sliced from the single crystal ingot and containing no I-region for the entire plane as described above, substantially no projections or projection-like particles are generated on the epitaxial layer, and thus an epitaxial silicon wafer of high quality can be produced.

In the above method, when the silicon single crystal is grown by the Czochralski method, a magnetic field can be applied.

By applying a magnetic field as mentioned above, convection of silicon melt along the transverse direction with respect to the magnetic line can be suppressed and hence the temperature gradient in the silicon melt can be made larger. Therefore, it becomes possible to realize a higher crystal growth rate.

In the above method, by using the growth condition of silicon single crystal F/G [mm$^2$/° C.·min] (F is the crystal growth rate [mm/min] and G is the temperature gradient [° C./mm] along the crystal growth axis direction in the vicinity of the single crystal growing interface) of 0.18 mm$^2$/° C.·min or more, there can be grown a single crystal ingot having a resistivity of 0.03 Ω·cm or more and providing the V-region for an entire plane in the crystal along the radial direction.

When a single crystal to be produced has a resistivity of 0.03 Ω·cm or more, if a single crystal is grown with the growth condition F/G of 0.18 mm$^2$/° C.·min or more as described above, a single crystal ingot providing the V-region for the entire plane can be grown, and an epitaxial silicon wafer having substantially no projection-like particles can be produced by depositing an epitaxial layer on a silicon wafer sliced from the aforementioned single crystal ingot and having the V-region for the entire plane.

Furthermore, by using a growth condition F/G of silicon single crystal for satisfying the following equation, a P-type single crystal ingot having a low resistivity of 0.03 Ω·cm or less and having the V-region for an entire plane can be grown.

$$F/G > 720 \cdot \rho^2 - 37 \cdot \rho + 0.65$$

In the equation, ρ is resistivity of single crystal [Ω·cm], F is the single crystal growth rate [mm/min], and G is the temperature gradient [° C./mm] along the crystal growth axis direction in the vicinity of the single crystal growing interface.

When a single crystal to be produced is a P-type crystal having a resistivity of 0.03 Ω·cm or less, if the single crystal is grown with the growth condition F/G satisfying the above equation in which F/G is represented as a function of the resistivity of the single crystal to be produced, a crystal ingot having the V-region for an entire plane along the radial direction of the crystal can be grown, and an epitaxial silicon wafer having substantially no projection-like particles can be produced by depositing an epitaxial layer on a silicon wafer sliced from the aforementioned single crystal ingot and having the V-region for the entire surface.

In the above method, it is desirable that the single crystal is produced by applying a horizontal magnetic field with a center magnetic field strength of 500 to 6000 Gauss.

In the MCZ method, by applying a horizontal magnetic field (henceforth also referred to as the "HMCZ method") with a center magnetic field strength of 500 to 6000 Gauss, vertical convection of the silicon melt in a crucible is efficiently suppressed and hence the amount of vaporized oxygen is suppressed in the vicinity of the crystal. Thus, the oxygen concentration distribution in a plane along the radial direction of the crystal is made more uniform, and the crystal growth at a higher growth rate can be realized without causing deformation of the crystal. Further, since the vertical convection is suppressed, the temperature gradient (dT/dZ)m of the silicon melt under the crystal can be made smaller, and thus the growth rate can be made higher.

Furthermore, it is desirable to use an internal structure of a furnace that can produce a portion having a temperature gradient G of 3.0° C./mm or more in at least a part of distribution of the temperature gradient G along the radial direction.

It is easy to use an internal structure of a furnace providing a low G in order to obtain an F/G in the range defined above. However, it leads to reduction of productivity. In contrast, if there is used an internal structure of a furnace that can produce a portion having a temperature gradient G of 3.0° C./mm or more in at least a part of the temperature gradient distribution along the radial direction as described above and a growth rate F that gives an F/G providing the V-region for the entire surface of a wafer, reduction of productivity can be avoided.

Further, in the above method, it is desirable to use a crystal rotation of 10 rpm or less during the growth of single crystal.

In order to obtain the V-region for the entire wafer surface, it is desirable to use a higher growth rate. However, a higher growth rate F may generate deformation of crystal. In order to suppress this deformation, it is effective to use a lower crystal rotation rate. However, a lower crystal rotation rate is generally undesirable, since it may induce unevenness of oxygen concentration within the crystal growth interface. In particular, it may cause warp of wafers in the device production process, and thus it may lead to a serious problem. However, in the present invention, since a horizontal magnetic field is applied and hence the vertical convection is suppressed, the oxygen concentration distribution in the plane is not unduly degraded even if the crystal rotation rate is lowered, and a higher growth rate may be used without generating deformation of the crystal.

Further, according to the present invention, it becomes possible to produce a large diameter single crystal ingot having a diameter of 250 mm (10 inches) or more in the production of single crystals.

If the aforementioned single crystal growth condition is satisfied according to the present invention, a single crystal having a diameter of 10 inches or more can relatively easily be grown so that it should have the V-region for an entire plane along the radial direction, and generation of projections on epi-wafers can be prevented.

Further, the epitaxial silicon wafer of the present invention is an epitaxial silicon wafer characterized by being produced by the aforementioned production method.

As described above, the epitaxial silicon wafer obtained by the method of the present invention can be an epitaxial silicon wafer of high quality that does not have projections having a size of 100 nm or more and a height of 5 nm or more on the epi-layer and does not adversely affect the characteristics and reliability of devices.

Furthermore, the substrate for an epitaxial silicon wafer of the present invention is a substrate for an epitaxial silicon wafer produced by the aforementioned production method and characterized in that it has an oxygen concentration distribution in a plane of 10% or less.

The substrate for an epitaxial silicon wafer obtained by the method of the present invention has a low oxygen concentration distribution in a plane of 10% or less as described above, and therefore it can be a substrate for an epitaxial silicon wafer of high quality that does not adversely affect the characteristics and reliability of devices.

As explained above, according to the present invention, a silicon single crystal of high quality that dose not contain the I-region for an entire plane along the radial direction of the single crystal and does not generate projections (particle-like scattering) when it is processed into an epi-wafer, which are qualitative characteristics suitable for a silicon single crystal for an epitaxial wafer substrate, can be produced with improved yield and productivity, and thus it enables marked reduction of the production cost for single crystals.

This enables providing a silicon single crystal suitable for large diameter epi-wafers, which are considered to be a mainstream in future, or suitable as a single crystal of low resistivity, which is the current mainstream. Therefore, there can be provided epitaxial silicon wafers of high quality that do not have projection or projection-like particles at low cost, and thus yield of the device production and characteristics and reliability of devices can markedly be improved.

BRIEF EXPLANATION OF THE DRAWINGS

FIG. 4($b$) is a view showing a result of high sensitivity particle measurement performed for a surface of epitaxial film, which is formed on a wafer surface having the I-region in the peripheral portion thereof.

FIG. 7($b$) is a view showing a result of high sensitivity particle measurement performed for a surface of epitaxial film, which is formed on a wafer surface of the present invention that does not contain the I-region.

BEST MODE FOR CARRYING OUT THE INVENTION

Figure 1:
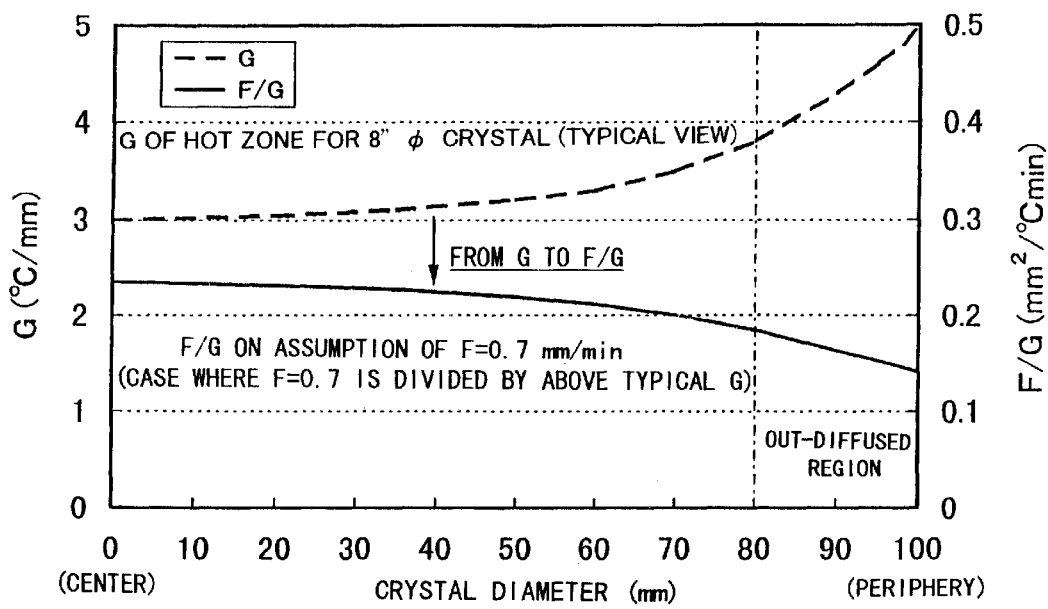
FIG. 1 is a typical view showing distributions of the temperature gradient G and the growth condition F/G in a plane immediately above the crystal growth interface.

Hereafter, the present invention will be explained in detail. However, the present invention is not limited by the explanation.

During the study of the inventors of the present invention about growth of epi-layers of epitaxial wafers, it became more frequent to find, on the epi-wafers, particles that have not been observed on conventional wafers. Study of these particles has revealed that they are particles that are detected on mirror wafer surfaces used as substrates by the high sensitivity particle measurement method, and they constitute projections or projection-like surface distortion as observed by AFM (atomic force microscope) or the like.

Through detailed investigation about the regions where the projections or projection-like surface distortion observed as particles were generated, it was found that such regions corresponded to distribution of the I-regions generated during the growth of a single crystal of silicon wafers used as substrates. That is, it is considered that, as the diameter of a single crystal becomes larger, the single crystal growth rate is decreased and hence the I-region becomes likely to be generated in crystals, and therefore particles come to be observed on epi-wafers. Further, observation of such substrate wafers having these I-regions by the high sensitivity measurement method using a particle counter revealed that the particles were correspondingly detected in the I-regions.

The high sensitivity measurement method is a measurement method that can detect scattered light strength even at a level of about ¼ of the conventional detection limit thanks to the improvement of S/N ratio. Therefore, it was found that a substrate wafer containing no I-region should be suitable as a silicon wafer for an epitaxial substrate.

On the other hand, influence of projections or projection-like particles on the epi-layers on characteristics and reliability of devices was investigated. As a result, it was found that, if the particles had a size of 100 nm or less and a height of 5 nm or less, they did not have influence at all. Therefore, if a silicon wafer that does not contain projections or projection-like particles in a size larger than the above-defined size is used as a substrate of epi-wafer, there would be obtained an epitaxial silicon wafer of high quality.

In order to produce such a wafer not containing the I-region and not having large projections, F and G can be controlled so that the single crystal growth condition F/G should exceed a predetermined value at any point along the radial direction of the crystal.

For example, in a crystal having a resistivity of 0.03 Ω·cm or more, the value of F/G can be controlled to be 0.18 mm$^2$/° C.·min or more. In a usually used hot zone, not a hot zone in which G is specially controlled to be low in order to reduce grown-in defects, G is 2.5 to 4.5° C./mm at the center of crystal, and 3.0 to 6.0° C./mm in a peripheral portion at a distance of 20 mm from the outermost periphery. Therefore, it can be understood that, for satisfying the aforementioned F/G, F should be at least around 0.55–1.1 mm/min. However, in large diameter crystals having a diameter of 10 inches or more, since solidification latent heat generated during the crystallization of the silicon melt becomes large, the possible growth rate is lowered and it becomes impossible to attain such a growth rate as mentioned above.

Figure 2:
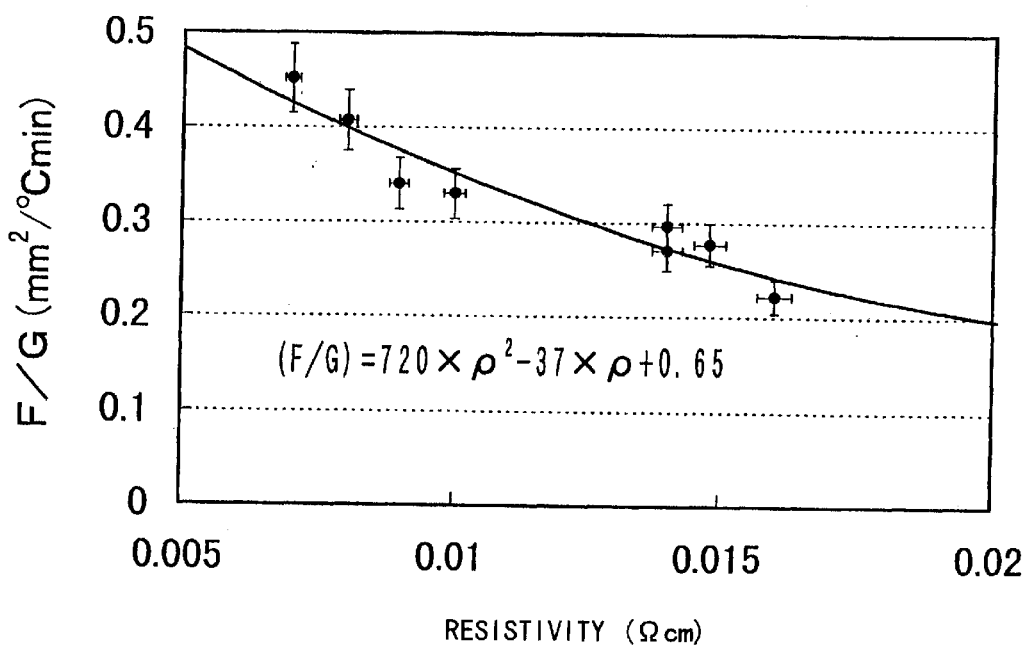
FIG. 2 is an explanatory view showing the resistivity dependency of the growth condition F/G at which an OSF ring is generated in a P-type low resistivity single crystal.

Furthermore, as to a P-type low resistivity single crystal having a resistivity of 0.03 Ω·cm or less, which is currently often used as an epi-wafer substrate, it was found that, based on results of experiments, F/G should satisfy the following equation as a function of resistivity of the single crystal ρ [Ω·cm] in order to obtain the V-region for the entire surface of the wafer (see FIG. 2).

$$F/G > 720 \cdot \rho^2 - 37 \cdot \rho + 0.65$$

In the equation, F is the single crystal growth rate [mm/min], and G is the temperature gradient [° C./mm] along the crystal growth axis direction in the vicinity of the single crystal growing interface.

Therefore, if G is 4.0° C./mm in a peripheral portion at a distance of 20 mm from the periphery, F must satisfy F>1.03 mm/min when ρ is 0.015 Ω·cm, F>1.41 mm/min when ρ is 0.010 Ω·cm, F>1.71 mm/min when ρ is 0.007 Ω·cm and F>1.93 mm/min when ρ is 0.005 Ω·cm. Such high growth rates cannot be easily attained.

Anyway, in order to satisfy the above equation, it is necessary to lower G by changing the hot zone or to use a higher growth rate to realize a desired F/G.

However, it is not preferable to lower G by changing the hot zone, since it may cause decrease of the possible growth rate and hence degradation of productivity.

Therefore, according to the present invention, the above problem is solved by using a higher growth rate while maintaining a conventional hot zone in which G in a peripheral portion at a distance of 20 mm from the outermost periphery is 3.0° C./mm or more.

According to the present invention, the horizontal magnetic field applied CZ method (HMCZ method) and low-speed crystal rotation are used for realizing a higher growth rate. The possible crystal growth rate Vmax in the CZ method is decided by heat balance of a growing crystal.

The heat quantity entering into the crystal consists of the heat quantity Hin entering from the silicon melt into the crystal and the solidification latent heat Hsol generated upon the phase change of the silicon from liquid to solid. As for the heat balance in the vicinity of the growing crystal, it is considered that the heat quantity Hout ejected from the crystal is equal to the sum of Hin+Hsol. It is considered that Hin is proportional to the temperature gradient (dT/dZ)m of the silicon melt below the crystal along the axial direction, Hsol to the crystal growth rate F, and Hout to the temperature gradient G of the crystal immediately above the crystal growth interface, respectively (see FIG. 3).

Since Hsol becomes larger as the growth rate becomes higher, it is necessary to make Hout larger or Hin smaller in order to improve the possible growth rate. In this respect, because the object of the present invention is to grow a crystal having no I-region by improving the growth rate without changing the hot zone, i.e., without changing G, Hout is fixed. Therefore, it is necessary to make Hin smaller.

Then, according to the present invention, a magnetic field is used. In particular, application of horizontal magnetic field enables a smaller temperature gradient (dT/dZ)m of the silicon melt below the crystal along the axial direction, and hence a smaller Hin (see Fumio Shimura; Semiconductor Silicon Crystal Technology, 1989). Furthermore, by applying a magnetic field, the temperature gradient (dT/dX)m of the silicon melt along the radial direction can be made larger, and hence solidification from a crucible wall, which occurs when a crystal is grown at a high growth rate, can be prevented (see Nikkei Microdevice, July, 1986). With these effects, the upper limit of Fmax can be elevated. However, the growth rate defined above could not be attained only with these effects.

That is, if the growth rate is made higher, deformation of crystal may occur. In order to suppress the deformation, it is effective to lower the crystal rotation. However, lowering the crystal rotation causes unevenness of oxygen concentration in the crystal growth interface. Such unevenness of oxygen concentration in a plane causes problems such as warp of wafers during the device production process, and therefore it is inappropriate for industrial products. This unevenness is caused by the reduction of oxygen concentration in the silicon melt due to evaporation in the vicinity of the growing crystal. In the conventional CZ method, such unevenness of oxygen concentration between the center and the peripheral portions is forcibly eliminated by forced convection caused by crystal rotation (see W. Zulehner et al.; Crystal, Vol. 8, 1982 etc.).

However, it is known that, when a magnetic field is applied, convection along the transverse direction with respect to the magnetic line is suppressed. In the HMCZ method, vertical convection is suppressed by the transverse magnetic line. For this reason, the thickness of the boundary diffusion layer does not become thinner in a peripheral portion as in the usual CZ method. Therefore, even if the crystal rotation is lowered, the distribution of the oxygen concentration in a plane is not unduly degraded. Thus, a lower crystal rotation can be used, and a higher growth rate can be realized without causing deformation of crystal.

According to the present invention, a horizontal magnetic field having a center magnetic field strength of 500 to 6000 Gauss is used, and crystal rotation during the growth of single crystal is controlled to be 10 rpm or less. Thanks to these characteristics, vertical convection of the silicon melt is efficiently suppressed, and unevenness is improved for the oxygen concentration between the center portion and the peripheral portion in a crystal growth interface, which is observed when the crystal rotation is lowered. Thus, a higher crystal growth rate can be realized without causing deformation of the crystal.

By using the approaches mentioned above, a higher crystal growth rate could be attained. This enables production of silicon single crystals not containing the I-region undesirable for epi-wafer substrates, providing the V-region for the entire surface of wafers, and not providing large projections, with good yield and high productivity.

The present invention will be explained hereinafter in more detail with reference to the appended drawings.

Figure 3:
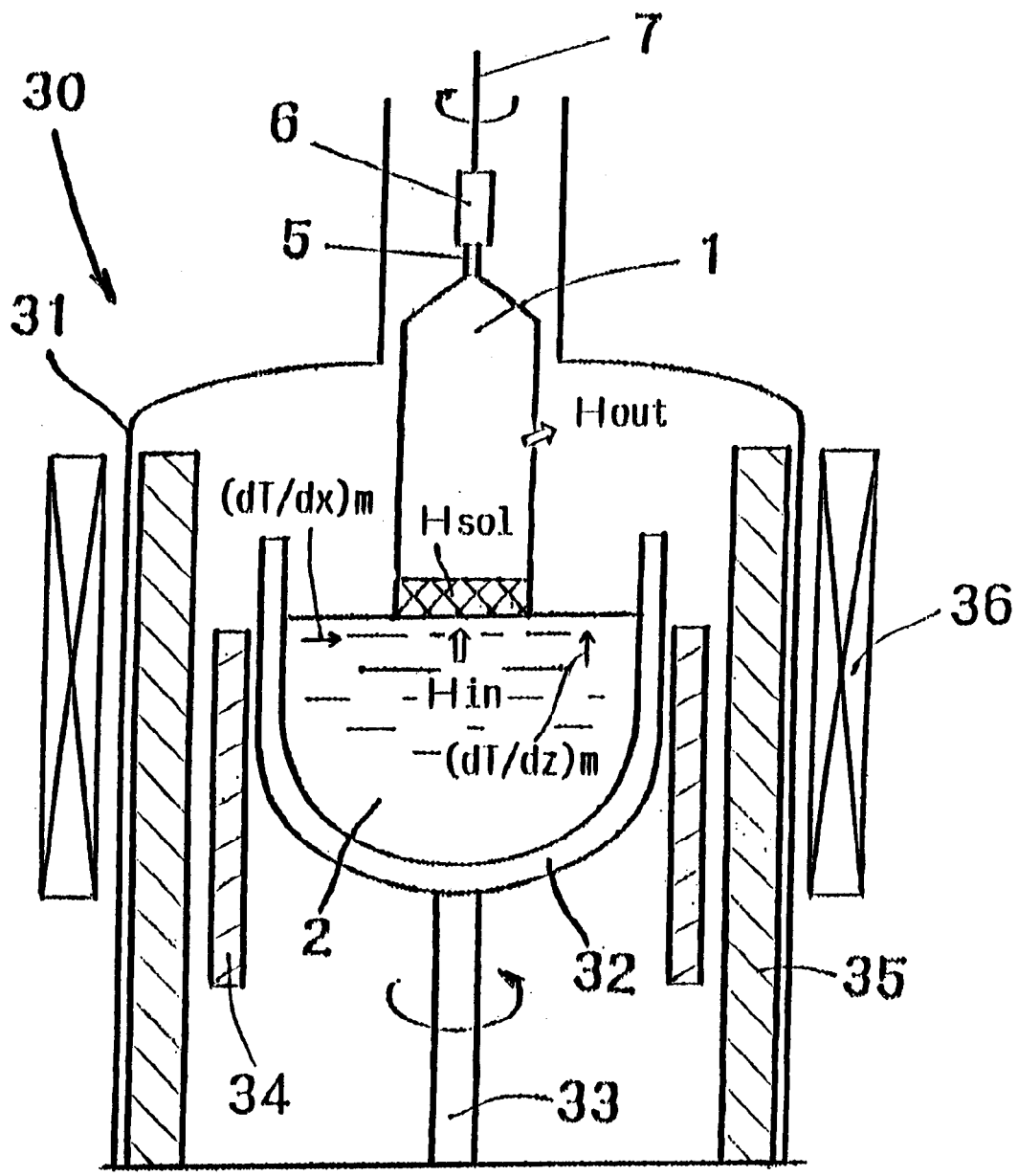
FIG. 3 is an explanatory view of a schematic single crystal pulling apparatus according to the HMCZ method and used for the present invention and the heat balance thereof.

First, an exemplary structure of the apparatus for pulling a single crystal by the HMCZ method used in the present invention will be explained by referring to FIG. 3. As shown in FIG. 3, the apparatus 30 for pulling a single crystal is constituted by a pulling chamber 31, crucible 32 provided in the pulling chamber 31, heater 34 disposed around the crucible 32, crucible-holding shaft 33 for rotating the crucible 32 and rotation mechanism therefor (not shown), seed chuck 6 for holding a silicon seed crystal 5, wire 7 for pulling the seed chuck 6, and winding mechanism (not shown) for rotating and winding the wire 7. The crucible 32 is composed of an inner quartz crucible for accommodating a silicon melt (molten metal) 2, and an outer graphite crucible. Further, insulating material 35 surrounds the outside of the heater 34.

Further, a magnet 36 for horizontal magnetic field is installed outside the pulling chamber 31 in the horizontal direction to apply horizontal magnetic field to the silicon melt 2 as the HMCZ method so as to suppress the convection of the silicon melt 2 and attain stable growth of a single crystal.

Now, the method for growing a single crystal by the aforementioned single crystal pulling apparatus 30 according to the HMCZ method will be explained hereinafter.

First, a silicon polycrystal material of high purity is melted in the crucible 32 by heating to a temperature higher than the melting point (about 1420° C.). Then, a horizontal magnetic field is applied, and a tip end of the seed crystal 5 is brought into contact with, or immersed into the surface of the melt 2 at its approximate center portion by reeling out the wire 7. Then, the crucible-holding shaft 33 is rotated in an optional direction, and the seed crystal 5 is simultaneously pulled upwardly by winding up the wire 7 with rotating the wire to start the growing of single crystal. Thereafter, a single crystal ingot 1 approximately in a columnar shape can be obtained by appropriately controlling the pulling rate and temperature.

By appropriately controlling F/G [mm$^2$/° C.·min] represented with the single crystal growth rate F [mm/min] and the temperature gradient G [° C./mm] along the crystal growth axis direction in the vicinity of the single crystal growth interface during the pulling of the approximately columnar single crystal ingot 1, a single crystal which does not contain the I-region can be obtained.

If the silicon single crystal produced by the production method and the apparatus explained above is grown under appropriate conditions of the HMCZ method of the present invention, there can be obtained a single crystal ingot which has extremely little deformation in spite of the high growth rate, would not contain the I-region for entire plane when it is processed into a wafer, and would not cause large projections when it is processed into an epitaxial wafer.

As for the epitaxial silicon wafer of the present invention, an epitaxial silicon wafer without surface distortion observed as projections or projection-like particles on the surface can be obtained by producing a mirror surface wafer from a wafer sliced from a single crystal ingot not containing the I-region for an entire plane along the radial direction, which is produced by, for example, the production method and the apparatus described above, and depositing an epitaxial film on the wafer as a substrate by a conventional CVD technique.

The silicon epitaxial growth by the CVD technique is performed by, for example, introducing raw material gas containing silicon in a reaction furnace together with carrier gas (usually H$_2$), and allowing deposition of Si produced by pyrolysis or reduction on a silicon substrate heated to an elevated temperature of 1000° C. or more. As the raw material gas, four kinds of compounds, SiCl$_4$, SiHCl$_3$, SiH$_2$Cl$_2$ and SiH$_4$, are usually used. As for the reaction temperature, in case of SiCl$_4$, it should be as high as 1150–1200° C. for hydrogen reduction by H$_2$. As the ratio of chlorine in the compounds decreases, it may be lowered, and in case of SiH$_4$, the growth is attained at 1000–1100° C. by pyrolysis reaction.

As the epitaxial growth apparatus, a horizontal type furnace, vertical (disc) furnace, barrel type furnace, single wafer processing furnace and so forth are used. However, the mainstream is shifted from the batch type processing, in which multiple wafers are simultaneously treated, to the single wafer processing, in which wafers are processed one by one, with use of silicon substrates of a larger diameter, in order to improve productivity and uniformity of film thickness and resistivity.

The present invention will be explained with reference to the following specific embodiments. However, the present invention is not limited to these.

The following test was performed first in order to confirm what kind of conditions could prevent the generation of projections or projection-like particles when an epitaxial layer was grown on a silicon wafer of a large diameter.

(Test 1)

A single crystal ingot having a diameter of 8 inches was pulled under a growth condition F/G of 0.155 mm$^2$/° C.·min at a distance of 20 mm from the outermost periphery so that it should have a resistivity in the range of 8–12 Ω·cm, and a wafer having the I-region for its substantially entire surface was prepared from the ingot (henceforth referred to as W-1). Another single crystal ingot was similarly pulled under a growth condition F/G of 0.239 mm$^2$/° C.·min at a distance of 20 mm from the outermost periphery, and a wafer not having the I-region for its substantially entire surface was prepared from the ingot (henceforth referred to as W-2).

For calculation of G, for example, a global heat transfer analysis software, called FEMAG (F. Dupret, P. Nicodeme, Y. Ryckmans, P. Wouters and M. J. Crochet, Int. J. Heat Mass Transfer, 33, 1849 (1990)), was used to calculate the distance between the points of the melting point of silicon, 1412° C., and 1400° C., and a value obtained by dividing 12° C. (1412° C.–1400° C.) by the distance was used as G (° C./mm).

Figure 4:
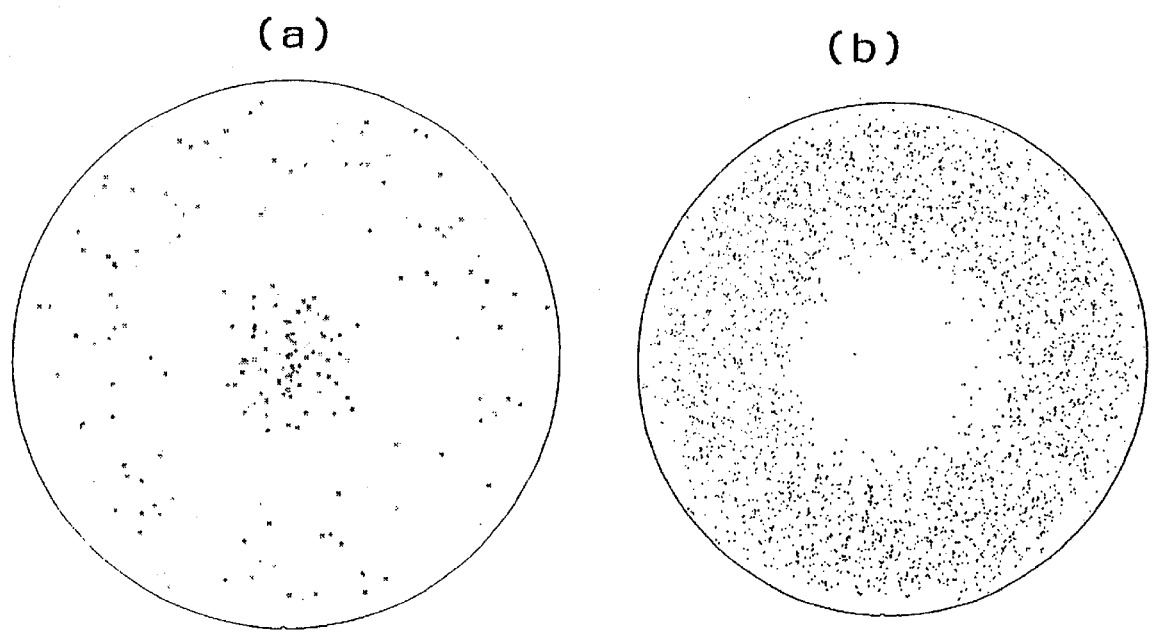
FIG. 4($a$) is a view showing a result of high sensitivity particle measurement performed for a wafer surface that has the I-region in the peripheral portion thereof.
Figure 5:
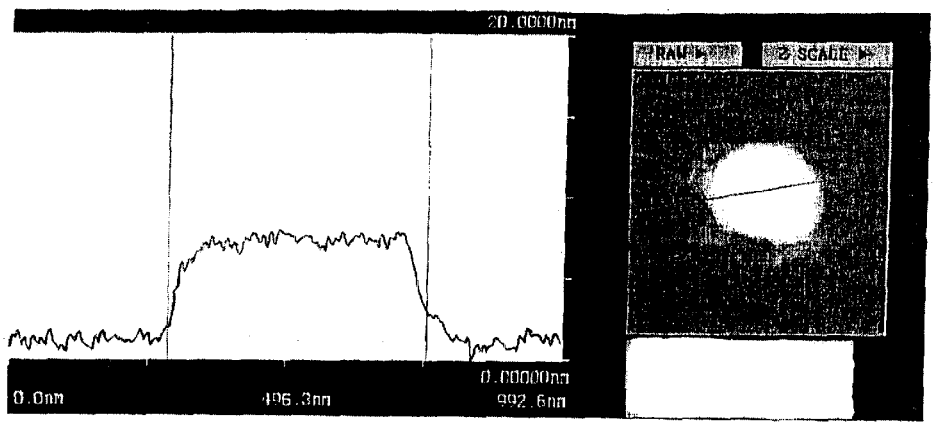
FIG. 5 is a resultant view showing an exemplary projection observed by AFM of particles observed in a peripheral portion of the polished silicon wafer of the present invention shown in FIG. 4($a$).
Figure 6:
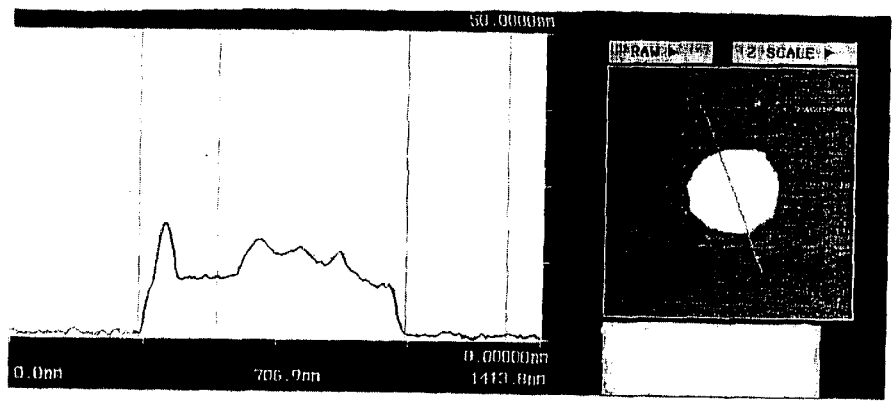
FIG. 6 is a resultant view showing an exemplary projection observed by AFM of particles observed in the epitaxial silicon wafer shown in FIG. 4($b$).

When these wafers were observed by using a particle counter of high sensitivity, scattering of very small particles was detected in a peripheral portion, which corresponded to the I-region of W-1 [see FIG. 4(a)]. When these were investigated by AFM, they were found to be projections [see FIG. 5]. When an epitaxial layer having a thickness of 2 μm was deposited on it, particles were observed at the same location as the location where the scattering of very small particles was observed [see FIG. 4(b)]. These were also found to be projections by using AFM (see FIG. 6). They had a size as large as 100 nm to 1000 nm, and height as large as 5 nm to 20 nm.

Figure 7:
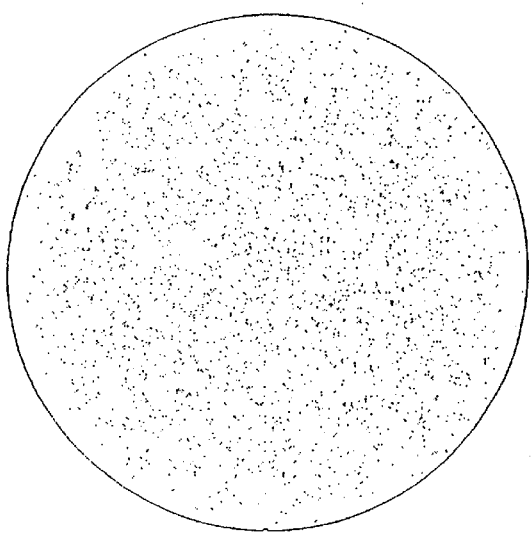
FIG. 7($a$) is a view showing a result of high sensitivity particle measurement performed for a wafer surface of the present invention that does not contain the I-region.
Figure 7:
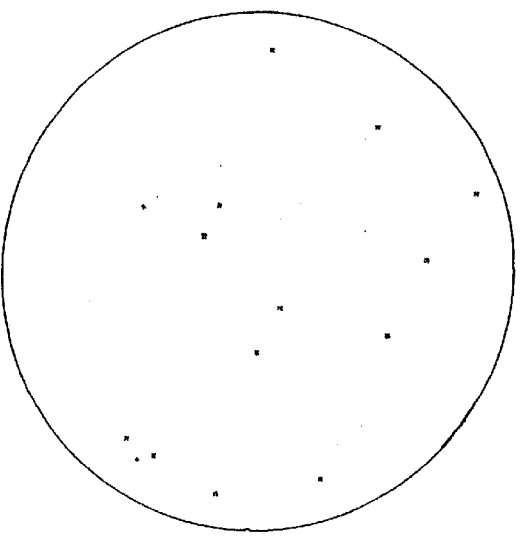

On the other hand, in W-2, although particles were observed at a high density for the entire surface of the wafer, substantially no projection-like particles were observed [see FIG. 7(a)]. When an epitaxial layer was deposited on it, substantially no particles were observed [see FIG. 7(b)]. No projection was confirmed even if it was observed by AFM.

From the results of these tests, it was found that, if a silicon wafer which did not contain the I-region for the entire surface is used as a substrate for an epitaxial wafer, projections or projection-like particles were not generated on the wafer surface even after an epitaxial layer was grown on the wafer surface. Based on this result, production conditions for obtaining appropriate quality for wafers of a further larger diameter were established.

EXAMPLE 1

A single crystal having a diameter of 12 inches and a resistivity of about 10 Ω·cm was grown from a crucible having a diameter of 28 inches at a crystal rotation of 7.0 rpm by the HMCZ method where a horizontal magnetic field of a center magnetic field strength of 4000 Gauss was applied. The hot zone used in this case provided G of 3.55° C./mm at a distance of 20 mm from the outermost periphery of the crystal. The crystal could be grown at a growth rate of 0.99 mm/min. The F/G was 0.279 mm$^2$/° C.·min at a distance of 20 mm from the outermost periphery of the crystal.

A wafer-like sample was sliced from this single crystal ingot, and oxygen concentration was measured at its center and peripheral location (location at 10 mm from the edge along the direction toward inner portion). Oxygen concentration distribution in a plane was determined as (|Center concentration−Peripheral concentration|/Center concentration)×100(%). As a result, the oxygen concentration distribution in a plane was 5% or less. No OSF ring was observed in the wafer-like sample sliced from this crystal, and thus a crystal that did not contain the I-region could be obtained.

An epitaxial layer having a thickness of 2 μm was grown on the silicon wafer obtained as described above under SiHCl$_3$+H$_2$ gas atmosphere at 1200° C. When its surface was investigated with a particle counter, no projection or projection-like particle was observed on the epi-layer of the epi-wafer.

Comparative Example 1

A single crystal having a diameter of 12 inches and a resistivity of about 10 Ω·cm was grown from a crucible having a diameter of 28 inches in the same manner as in Example 1, except that it was grown by the usual CZ method which did not use a magnetic field.

In this case, the upper limit of growth rate was about 0.61 mm/min, and F/G was 0.172 mm$^2$/° C.·min at a distance of 20 mm from the outermost periphery of the crystal.

As for a wafer-like sample sliced from this crystal, the location of OSF (oxidation-induced stacking fault) ring existing inside the I-region was investigated, and it was found at a location of about 30 mm from the outermost periphery. Therefore, it was confirmed that a peripheral portion of the wafer consisted of the I-region. Further, the oxygen concentration distribution in a plane was determined and found to be about 12%. When an epi-layer was deposited on this wafer, large projections were observed in the peripheral portion.

Since the emergence of the OSF ring also depends on the oxygen concentration in the crystal, erroneous determination may occur in such evaluation as described above. Therefore, the oxygen concentration of the crystal used for this evaluation was controlled to be 13 ppma or more (JEIDA), and a heat treatment was performed at 1000° C. for 3 hours and at 1150° C. for 100 minutes. Further, if an OSF ring was not detected after a single heat treatment, a heat treatment at 1150° C. for 100 minutes was additionally performed before evaluation. When any OSF ring was not observed after two times of heat treatment, it was determined that the OSF ring was not detected.

EXAMPLE 2

Two kinds of P-type low resistivity crystals having a diameter of 8 inches and a resistivity of 0.03 Ω·cm or less were prepared with different resistivities. These crystals were evaluated for the OSF ring in the same manner as in Comparative Example 1 to determine the relationship between the location of OSF ring and the growth condition F/G. As a result, it was found that, in order to prevent the I-region that is present outside the OSF ring from entering into the crystal, F/G should satisfy the condition represented by the following equation, in which F/G is defined as a function of resistivity ρ [Ω·cm] (see FIG. 2).

$$F/G > 720 \cdot \rho^2 - 37 \cdot \rho + 0.65$$

In the equation, ρ is resistivity of single crystal [Ω·cm], F is the single crystal growth rate [mm/min], and G is the temperature gradient [° C./mm] along the crystal growth axis direction in the vicinity of the single crystal growing interface. Based on the above, a crystal not containing the I-region was prepared as follows as an experiment.

A crystal having a diameter of 8 inches and a resistivity of 0.015 Ω·cm was grown at a growth rate of 1.4 mm/min by using a hot zone that provided G of 3.74° C./mm at a distance of 20 mm from the outermost periphery of the crystal. The oxygen concentration distribution in a plane obtained by the gas fusion method was 10% or less. At a resistivity of 0.015 Ω·cm, the necessary F/G is determined to be 0.257 mm$^2$/° C.·min according to the above equation, and the F/G of the crystal grown in this experiment was 0.374 mm$^2$/° C·min at a distance of 20 mm from the outermost periphery. No OSF ring was detected in a wafer-like sample sliced from this crystal. Therefore, it was confirmed that the entire wafer surface consisted of the V-region.

EXAMPLE 3

A crystal having a diameter of 8 inches and a resistivity of 0.008 Ω·cm was grown at a growth rate of 1.78 mm/min by using a hot zone that provided G of 4.33° C./mm at a distance of 20 mm from the outermost periphery of the crystal. The oxygen concentration distribution in a plane obtained by the gas fusion method was 10% or less. At a resistivity of 0.008 Ω·cm, the necessary F/G is determined to be 0.40 mm$^2$/° C.·min according to the above equation. The F/G of the crystal grown in this experiment was 0.41 mm$^2$/° C.·min at a distance of 20 mm from the outermost periphery. No OSF ring was detected in a wafer-like sample sliced from this crystal. Therefore, it was confirmed that the entire wafer surface consisted of the V-region.

As described above, it was confirmed that, if an F/G exceeding the value calculated according to the above equation was used, there was obtained a crystal that did not contain the I-region.

When an epitaxial layer having a thickness of 2 μm was grown on these two kinds of wafers in the same manner as described above, no projection or projection-like particle was not observed on the epi-layers of the epi-wafers.

Comparative Example 2

A crystal having a diameter of 8 inches and a resistivity of 0.014 Ω·cm was grown at a growth rate of 1.0 mm/min by using the same hot zone as in Example 2, which provided G of 3.74° C./mm at a distance of 20 mm from the outermost periphery of the crystal. At a resistivity of 0.014 Ω·cm, the necessary F/G is calculated to be 0.273 mm$^2$/° C.·min according to the above equation. But the F/G of the crystal grown in this experiment was 0.267 mm$^2$/° C.·min at a distance of 20 mm from the outermost periphery, and thus it was below the calculated value. As for a wafer-like sample sliced from this crystal, an OSF ring was detected at a location of 25 mm from the outermost periphery. Therefore, it was confirmed that the peripheral portion contained the I-region.

The above Comparative Example 2 shows one of the experiments sequentially performed for obtaining a relational expression of F/G~ρ. The reliability of the relational expression was improved by repeating similar experiments with different conditions, and it could be verified by Example 2 and Example 3.

The present invention is not limited to the embodiments described above. The above-described embodiments are mere examples, and those having the substantially same structure as that described in the appended claims and providing the similar functions and advantages are included in the scope of the present invention.

For example, the aforementioned embodiments were explained for cases where silicon single crystals having a diameter of 8 inches or 12 inches were grown. However, the present invention is not limited to them, and can also be applied to silicon single crystals having a diameter of, for example, 16 inches or larger.

What is claimed is:

1. An epitaxial silicon wafer, which has no projections having a size of 100 nm or more and a height of 5 nm or more on an epitaxial layer.

2. A method for producing an epitaxial silicon wafer, wherein a silicon wafer grown by the Czochralski method that has no projections having a size of 100 nm or more and a height of 5 nm or more is used as a silicon wafer for an epitaxial substrate, and an epitaxial layer is deposited on the silicon wafer.

3. An epitaxial silicon wafer, which is produced by the production method according to claim 2.

4. An epitaxial silicon wafer, which is produced by the production method according to claim 2 and has an oxygen concentration distribution in a plane of 10% or less.

5. A method for producing an epitaxial silicon wafer, wherein a silicon single crystal grown by the Czochralski method that contains no I-region (I-region means a region where self interstitial atoms are dominant compared with voids) is used as a silicon wafer for an epitaxial substrate, and an epitaxial layer is deposited on the silicon wafer.

6. An epitaxial silicon wafer, which is produced by the production method according to claim 5.

7. An epitaxial silicon wafer, which is produced by the production method according to claim 5 and has an oxygen concentration distribution in a plane of 10% or less.

8. A method for producing an epitaxial silicon wafer, wherein a silicon single crystal ingot containing no I-region is grown when a silicon single crystal is grown by the Czochralski method, and an epitaxial layer is deposited on a silicon wafer sliced from the single crystal ingot and containing no I-region for the entire plane.

9. The method for producing an epitaxial silicon wafer according to claim 8 wherein a magnetic field is applied when the silicon single crystal is grown by the Czochralski method.

10. The method for producing an epitaxial silicon wafer according to claims 9 wherein the applied magnetic field is a horizontal magnetic field with a center magnetic field strength of 500 to 6000 Gauss.

11. The method for producing an epitaxial silicon wafer according to claim 10 wherein crystal rotation is controlled to be 10 rpm or less during the growth of single crystal.

12. The method for producing an epitaxial silicon wafer according to claim 9 wherein crystal rotation is controlled to be 10 rpm or less during the growth of single crystal.

13. The method for producing an epitaxial silicon wafer according to claim 8 wherein a single crystal ingot having a resistivity of 0.03 Ω·cm or more and providing V-region (V-region means a region where voids are dominant compared with self interstitial atoms) for an entire plane in the crystal along the radial direction is grown by using a growth condition F/G [mm$^2$/° C.·min] (F is a single crystal growth rate [mm/min] and G is a temperature gradient [° C./mm] along the crystal growth axis direction in the vicinity of the single crystal growing interface) of 0.18 mm$^2$/° C.·min or more.

14. The method for producing an epitaxial silicon wafer according to claim 13 wherein an internal structure of a furnace that can produce a portion having a temperature gradient G of 3.0° C./mm or more in at least a part of distribution of the temperature gradient G along the radial direction is used.

15. The method for producing an epitaxial silicon wafer according to claim 8 wherein a P-type single crystal ingot having a low resistivity of 0.03 Ω·cm or less and having the V-region for an entire plane is grown by using a growth condition F/G of silicon single crystal for satisfying the following equation:

$$F/G > 720 \cdot \rho^2 - 37 \cdot \rho + 0.65$$

wherein ρ is resistivity of single crystal [Ω·cm].

16. The method for producing an epitaxial silicon wafer according to claim 15 wherein an internal structure of a furnace that can produce a portion having a temperature gradient G of 3.0° C./mm or more in at least a part of distribution of the temperature gradient G along the radial direction is used.

17. The method for producing an epitaxial silicon wafer according to claim 8 wherein a large diameter single crystal ingot having a diameter of 250 mm (10 inches) or more is produced in the production of single crystal.

18. An epitaxial silicon wafer, which is produced by the production method according to claim 8.

19. An epitaxial silicon wafer, which is produced by the production method according to claim 8 and has an oxygen concentration distribution in a plane of 10% or less.

* * * * *